United States Patent
Ishii

(10) Patent No.: US 8,384,867 B2
(45) Date of Patent: Feb. 26, 2013

(54) LIQUID CRYSTAL DISPLAY DEVICE

(75) Inventor: Hiromitsu Ishii, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 396 days.

(21) Appl. No.: 12/616,542

(22) Filed: Nov. 11, 2009

(65) Prior Publication Data

US 2010/0140624 A1 Jun. 10, 2010

(30) Foreign Application Priority Data

Dec. 5, 2008 (JP) ................................ 2008-311607

(51) Int. Cl.
*G02F 1/1335* (2006.01)
(52) U.S. Cl. ............................ 349/139; 349/146; 349/39
(58) Field of Classification Search .................. 349/139, 349/39
See application file for complete search history.

(56) References Cited

U.S. PATENT DOCUMENTS

| | | | |
|---|---|---|---|
| 6,335,776 B1 | 1/2002 | Kim et al. | |
| 6,400,427 B1 * | 6/2002 | Hanazawa et al. | 349/44 |
| 2004/0066474 A1 | 4/2004 | Nakano et al. | |
| 2004/0201811 A1 * | 10/2004 | Jun ............................. | 349/146 |
| 2005/0190316 A1 | 9/2005 | Takahashi et al. | |
| 2006/0114397 A1 * | 6/2006 | Mizusako et al. ............ | 349/139 |
| 2008/0284962 A1 * | 11/2008 | Horiguchi et al. ............ | 349/139 |

FOREIGN PATENT DOCUMENTS

| | | |
|---|---|---|
| CN | 1782839 A | 6/2006 |
| JP | 1992-358129 A | 12/1992 |
| JP | 1993-297412 A | 11/1993 |
| JP | 1999-344728 A | 12/1999 |
| JP | 2000-29059 A | 1/2000 |
| JP | 2003-5214 A | 1/2003 |
| JP | 2003-322865 A | 11/2003 |
| JP | 2005-241923 A | 9/2005 |
| JP | 2006-154564 A | 6/2006 |
| JP | 2006-276160 A | 10/2006 |
| JP | 2008-40291 A | 2/2008 |
| JP | 2008-46184 A | 2/2008 |
| JP | 2008-083389 A | 4/2008 |
| JP | 2008-170462 A | 7/2008 |

OTHER PUBLICATIONS

Japanese Office Action dated Dec. 7, 2010, in a counterpart Japanese patent application No. 2008-311607 citing Foreign Patent Document Nos. 1-7 listed above. Partial translation of the Office Action is attached as a concise explanation of relevance.

(Continued)

*Primary Examiner* — Eric Wong
(74) *Attorney, Agent, or Firm* — Chen Yoshimura LLP

(57) ABSTRACT

A liquid crystal display device, includes: a gate line (14) provided as a first conductive layer to extend the gate line in a predetermined direction; a thin film transistor (13) including a gate electrode (13a) connected to the gate line (14); a first pixel electrode (12) provided as a second conductive layer closer to a liquid crystal layer (30) side than the first conductive layer; a shielding electrode (17) provided as a conductive layer to be closer to the liquid crystal layer side than the first conductive layer and provided in a region between a location region of the gate line (14) and a location region of the first pixel electrode (12); a connection portion (13j) provided to at least partially overlap the shielding electrode (17) and provided to be closer to the first conductive layer side than the shielding electrode (17), the connection portion connecting a source electrode (13h) of the thin film transistor (13) with the first pixel electrode (12); and a common electrode (23) which is opposing the first pixel electrode (12) via the liquid crystal layer (30) and is set to have the same potential as the shielding electrode (17).

22 Claims, 9 Drawing Sheets

OTHER PUBLICATIONS

Japanese Office Action in a counterpart application No. 2008-311607, dated Apr. 5, 2011.

Korean Office Action dated Apr. 28, 2011, in a counterpart Korean patent application No. 10-2009-0114875, citing Foreign Patent document No. 1, JP2000-029059, JP H05-297412, JP2003-005214 and JP2003-322865, which have been submitted in a previous IDS.

Chinese Office Action dated May 20, 2011, in a counterpart Chinese patent application No. 200910253143.2, citing U.S. Patent Application Publication No. 2 and Foreign Patent document No. 2.

* cited by examiner

LIQUID CRYSTAL DISPLAY DEVICE

This application is based upon and claims the benefit of priority from the prior Japanese Patent Application No. 2008-311607, filed Dec. 5, 2008, the entire contents of which are incorporated herein by reference.

BACKGROUND OF THE INVENTION

1. Field of the Invention

The present invention relates to a liquid crystal display device.

2. Description of the Related Art

In a liquid crystal display device, including a pair of substrates which are opposing to each other with an interval, a plurality of pixel electrodes arranged in matrix, a plurality of thin film transistors provided in a corresponding manner to the plurality of pixel electrodes to be connected thereto, and a plurality of gate lines and signal lines for supplying a gate signal and date signal to each of corresponding thin film transistors are formed on one of the substrates. Moreover, common electrodes (opposite electrodes) which commonly oppose the plurality of pixel electrodes are formed on the other substrate. Then, liquid crystal is sealed in between the pair of substrates. Here, on each of the opposing surfaces of the pair of substrates, an alignment layer for regulating initial orientation state of liquid crystal molecules is provided. Then, in the liquid crystal display device orientation state of the liquid crystal changes when voltage is applied to a liquid crystal layer via the pixel electrodes of each pixel.

Especially in a vertical aligned liquid crystal display device disclosed in the JP 2008-83389A, protrusions are provided to one of the substrates so that liquid crystal molecules, which are oriented vertically to the substrate when voltage is not applied to the liquid crystal layer, can stably carry out orientation change when voltage is applied to the liquid crystal layer. In the vertical aligned liquid crystal display device having a substrate where protrusions are provided, liquid crystal molecules are oriented in a radial manner with each of the protrusions as its center when voltage is applied to the liquid crystal layer.

However, for example, because a thin film transistor is provided in the vicinity of the pixel electrode, an electric field generated by the gate electrode of the thin film transistor or the gate line connected to the gate electrode effects an electric field generated in a pixel electrode region. That is, if a spot having a different potential partially exists in the periphery of the pixel electrode, generation state of an electric field in this spot differs from other spots, and in such a case distortion is generated in the orientation state of liquid crystal molecules which are to be oriented in a radial fashion.

For example, as shown in FIG. 9, liquid crystal molecules 102 above a pixel electrode 101 connected to a thin film transistor 100 is influenced by an electric field of a gate electrode 100a and is pulled to a direction of an arrow in the figure. Then, center of liquid crystal orientation does not become a protrusion 103 but is shifted toward the gate electrode 100a. Thus, if distortion is generated in radial orientation of the molecules, there occurs a problem that visual scope differs by every direction and viewing angle performance is lowered.

Moreover, in a case where an external pressure is applied from a surface of the liquid crystal display device to temporarily change a cell gap and center position of the radial orientation is shifted from the protrusion along with the change, if there exists a spot where generation state of electric field differs in the periphery of the pixel electrode, the center positions of the radial orientation of some pixels do not return to the position of the protrusions but are trapped in the positions where generation state of electric field differs, for example, a position in the vicinity of the gate electrode of the thin film transistor. Thus, there occurs a problem that orientation state is transformed into a state which is different from the radial orientation. That is, even if the surface is pressed by a relatively weak force, there occurs a problem that variation in orientation state between pixels occurs and display quality is lowered.

SUMMARY OF THE INVENTION

Accordingly, an object of the present invention is to provide a liquid crystal display device which relatively equalizes electric potential in the periphery of a pixel electrode so that display quality is not easily lowered.

One aspect of the present invention provides the liquid crystal display device including: a pair of substrates facing each other via a liquid crystal layer; a gate line provided in one substrate of the pair of substrates, the gate line being disposed to extend in a first direction; a first storage capacity electrode disposed in a same layer as the gate line; a thin film transistor including a gate electrode connected to the gate line; a first pixel electrode disposed closer to the liquid crystal layer than the gate line through a first insulating layer and a second insulating layer; a shielding electrode provided in a same layer as the first pixel electrode, the shielding electrode being disposed such that, in a plan view, at least a part thereof is located in a planar region existing between the gate line and the first pixel electrode; a connection portion provided in a layer between the gate line and the first pixel electrode, the connection portion electrically connecting a source electrode of the thin film transistor with the first pixel electrode; and a common electrode that faces the first pixel electrode via the liquid crystal layer and that is set to have the same potential as the shielding electrode, wherein the first storage capacity electrode is set to have a same potential as that of the shielding electrode, wherein the first storage capacity electrode and the connection portion have an overlapping region in a plan view, wherein the shielding electrode covers a part of the overlapping region of the first capacity storage electrode and the connection portion through the second insulating layer along the first direction, wherein a length of the connection portion along the first direction is longer than a length of the source electrode along the first direction, and wherein a length of the shielding electrode along the first direction is longer than the length of the connection portion along the first direction.

Another aspect of the present invention provides the liquid crystal display device including: a pair of substrates facing each other through a liquid crystal layer; a gate line provided in one substrate of the pair of substrates, the gate line being disposed to extend in a first direction; a first storage capacity electrode and a second storage capacity electrode disposed in a same layer as the gate line, the first storage capacity electrode and the second storage capacity electrode being disposed on opposing sides of the gate line therebetween; a thin film transistor having a gate electrode connected to the gate line; a first pixel electrode and a second pixel electrode disposed closer to the liquid crystal layer side than the gate line through a first insulating layer and a second insulating layer, the first pixel electrode and the second pixel electrode being disposed on opposing sides of the gate line therebetween; a shielding electrode provided in a same layer as the first pixel electrode, the shielding electrode being disposed such that, in a plan view, at least a part thereof is located in a planar region existing between the first pixel electrode and the gate line a connection portion formed in a layer between the gate line and the first pixel electrode, the connection portion electrically connecting a source electrode of the thin film transistor and the first pixel electrode; and a common electrode disposed to face the first pixel electrode and the second pixel electrode via the liquid crystal layer, the common electrode being set to have a same potential as that of the shielding electrode, wherein the first storage capacity electrode and the second storage capacity electrode are set to have the same potential as that of the shielding electrode, wherein the shielding electrode is connected to the second storage capacity electrode through a contact hole formed in the first and second insulating layers, wherein the first storage capacity electrode and the connection portion have an overlapping region in a plan view, wherein the shielding electrode covers a part of the overlapping region of the first storage capacity electrode and the connection portion via the second insulating layer along the first direction, wherein a length of the connection portion along the first direction is longer than a length of the source electrode along the first direction, and wherein a length of the shielding electrode along the first direction is longer than the length of the connection portion along the first direction.

Another aspect of the present invention provides the liquid crystal display device comprising: a plurality of thin film transistors which are provided in a matrix and each of which respectively includes a source electrode, a drain electrode, and a gate electrode; an insulation layer covering each of the thin film transistors; a plurality of pixel electrodes formed on the insulation layer and each of which is respectively connected to each of the thin film transistors; a common electrode provided to each of the pixel electrodes via a liquid crystal layer; and a plurality of shielding electrodes formed between each of the pixel electrodes and each of gate electrodes of the thin film transistors on the insulation layer where each of the pixel electrodes is formed, to which same potential as that of the common electrode is applied.

Another aspect of the present invention provides the liquid crystal display device comprising: a thin film transistor; an insulation layer covering the thin film transistor; a pixel electrode formed on the insulation layer and connected to the thin film transistor; an opposite electrode provided to oppose the pixel electrode; a vertical alignment layer formed to cover the pixel electrode surface and the opposite electrode surface; a liquid crystal which intervenes between the pixel electrode and the vertical alignment layer formed on the opposite electrode and has negative permittivity anisotropy; and a shielding electrode formed between the pixel electrode and a gate electrode of the thin film transistor on the insulation layer where the pixel electrode is formed, to which same potential as that of the common electrode is applied.

According to a display device of the present invention, it becomes possible not to lower display quality by relatively equalizing electric potential in the periphery of a pixel electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE PREFERRED EMBODIMENTS

First Embodiment

Figure 1:
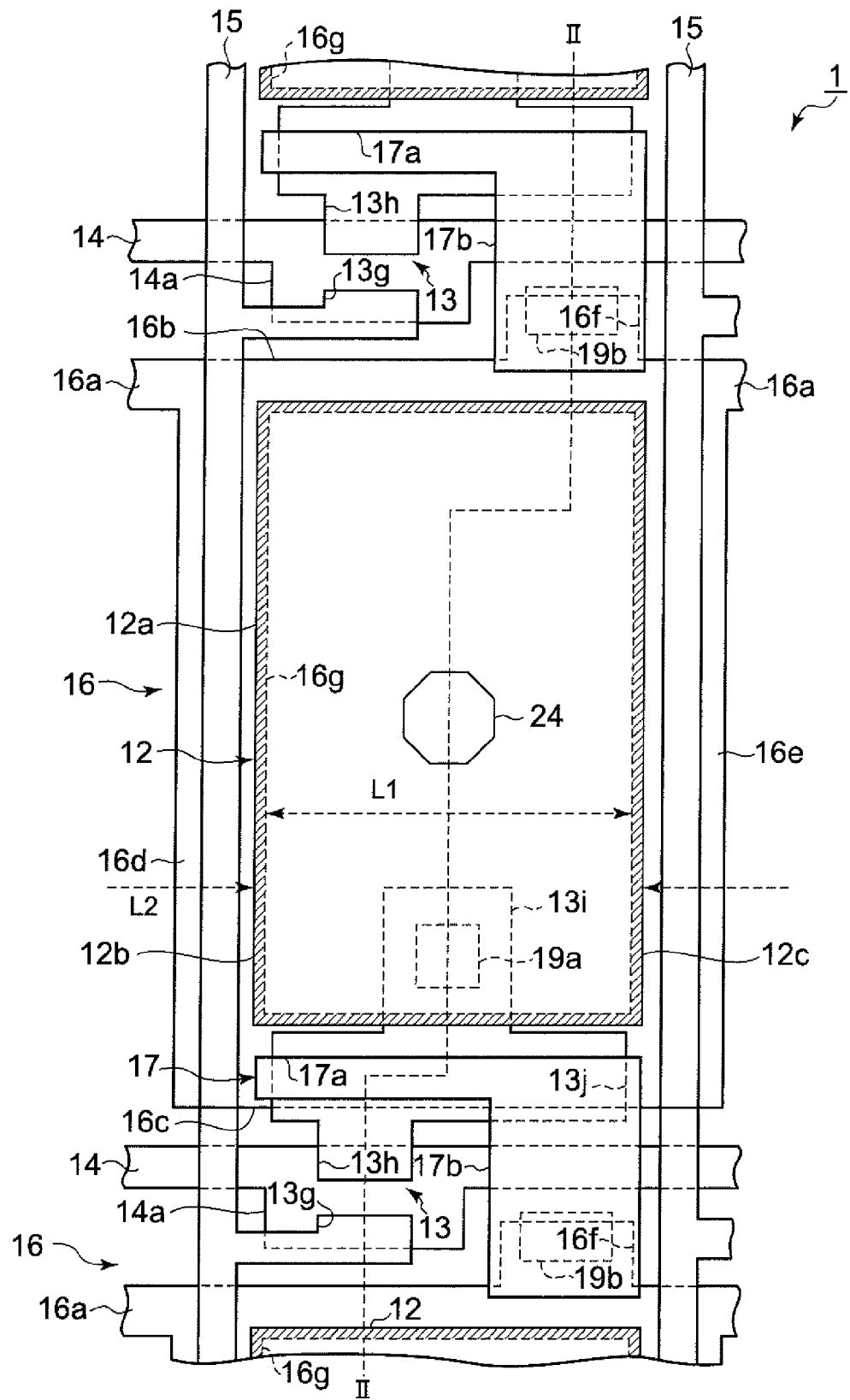
FIG. 1 is a plane view of a liquid crystal display device according to a first embodiment of the present invention.
Figure 2:
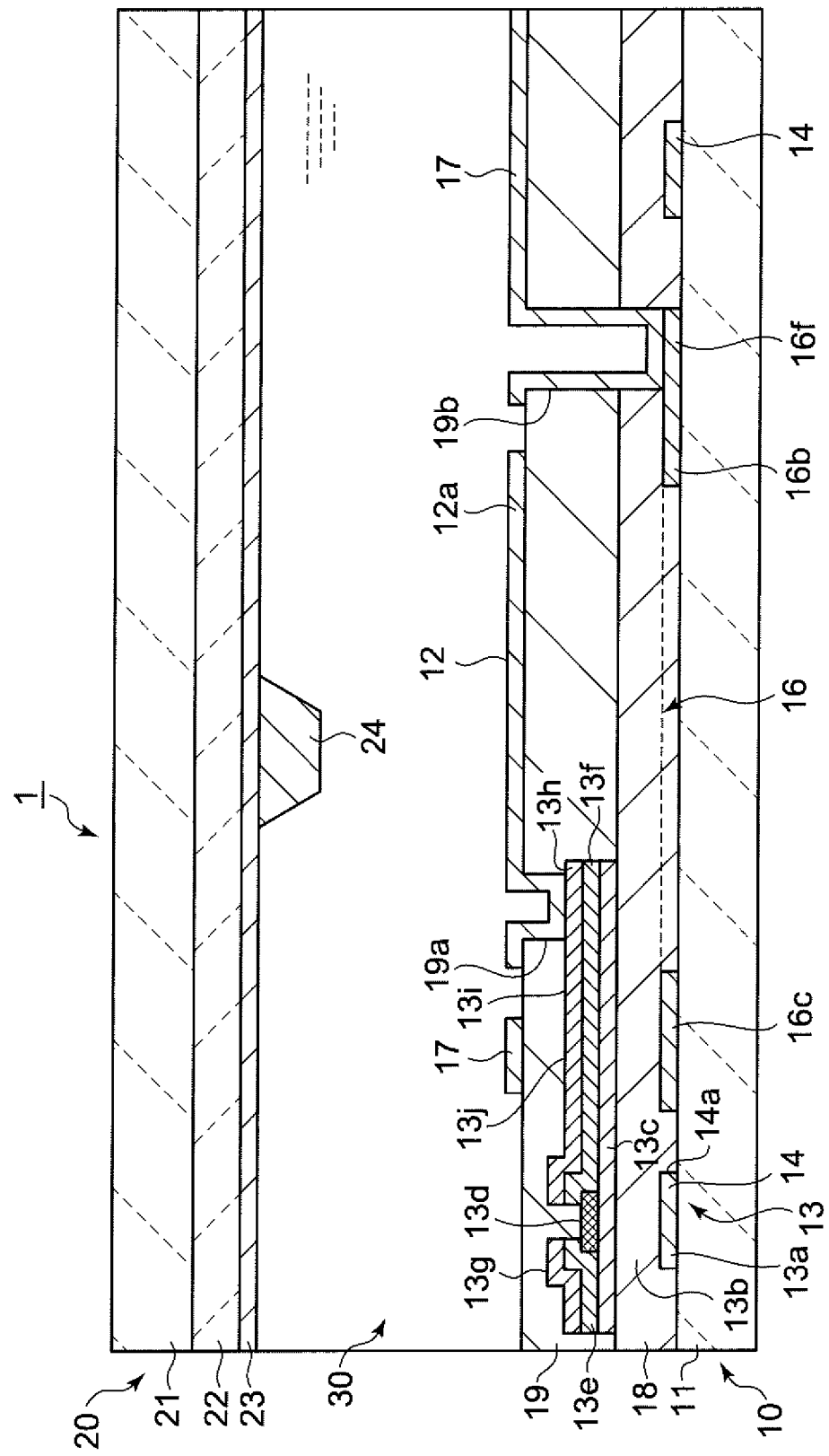
FIG. 2 is a cross-sectional view taken along II-II line in FIG. 1.

FIG. 1 is a plane view of a liquid crystal display device 1 according to a first embodiment of the present invention. FIG. 2 is a cross-sectional view taken along II-II line in FIG. 1. The liquid crystal display device 1 according to the first embodiment is an active matrix liquid crystal display device. A TFT substrate 10 and an opposite substrate 20 are provided with a predetermined interval and are opposing to each other. Liquid crystal is sealed in between the TFT substrate 10 and the opposite substrate 20 to form a liquid crystal layer 30.

The TFT substrate 10 includes a transparent substrate 11, a plurality of pixel electrodes 12 provided in matrix in the transparent substrate, a plurality of thin film transistors (TFT) 13 provided to correspond to each of the plurality of pixel electrodes 12 and connected to each of the corresponding pixel electrodes 12, a plurality of gate lines 14 and a plurality of signal lines 15 respectively provided in row and column direction to supply a gate signal or a data signal to each of the plurality of thin film transistors 13, a plurality of storage capacity electrodes 16 provided to each of the plurality of pixel electrodes 12, a plurality of shielding electrodes 17 provided in a corresponding manner to each of the plurality of pixel electrodes 12 and provided between a gate electrode 13a of the thin film transistor 13 which is connected to the pixel electrode 12 and the pixel electrode 12, and an alignment layer (not shown) provided on the surface of the TFT substrate 10.

Meanwhile, the opposite substrate 20 includes a transparent substrate 21, a color filter 22 provided on the surface of the transparent substrate 21, a common electrode (opposite electrode) 23 provided on the color filter 22, a plurality of protrusions 24 provided on the common electrode 23 in a corresponding manner to at least each of the pixel electrodes 12, and an alignment layer (not shown) provided on the surface of the opposite substrate 20, that is, on the common electrode 23, and the plurality of protrusions 24.

Here, the liquid crystal display device 1 displays an image by a plurality of display pixels and one pixel electrode is provided to one display pixel. That is, the display pixels are arranged in a matrix.

Configuration of the TFT substrate 10 will be explained in detail.

A plurality of gate lines 14 are provided on the transparent substrate 11 such as a glass substrate in column direction with an interval. Each of the gate lines 14 is provided to extend in row direction. A flared portion 14a is provided to each of the gate lines 14 so that width of the line is larger in each pixel region to form a gate electrode 13a. In the embodiment shown in FIG. 1, the flared portion 14a protrudes toward the storage capacity electrode 16 which is adjacent in column direction.

The storage capacity electrode 16 formed into frame between gate lines 14 and 14 which are adjacent to each other, is provided on the transparent substrate 11. The storage capacity electrodes 16 and 16 arranged in row direction are connected by a storage capacity line 16a to extend outside the liquid crystal display region. In detail, the storage capacity electrode 16 is formed into a frame at an upper side portion 16b, a lower side portion 16c, a left side portion 16d, and a right side portion 16e. The storage capacity line 16a connects the upper side portions 16b of the storage capacity electrodes 16 in each pixel region in row direction and the storage capacity line 16a extends outside the liquid crystal display region. A connection portion (not shown) is provided to the storage capacity line 16a outside the liquid crystal display region and same voltage as that to the common electrode 23 is applied to the storage capacity line 16a. As shown in FIG. 1, the upper side portion 16b of the storage capacity electrode 16 has a flared portion 16f which extends toward the gate line side adjacent in column direction. Here, the flared portion 14a of the gate line 14 and the flared portion 16f of the storage capacity electrode 16 are provided not to interfere with each other in row direction. As shown in FIG. 1, the flared portion 14a is provided to the left side and the flared portion 16f is provided to the right side. In the case shown in FIG. 1, since the storage capacity electrode 16, the storage capacity line 16a, and the gate line 14 are provided on an upper surface of the transparent substrate 11, they can be formed with one same metal such as Cr. That is, the storage capacity electrode 16, the storage capacity line 16a, and the gate line 14 are formed simultaneously as a bottom conductive layer.

A first insulation layer 18 is formed to cover the transparent substrate 11, the gate line 14, the storage capacity line 16a, and the storage capacity electrode 16.

On the first insulation layer 18, a plurality of signal lines 15 are provided in row direction with an interval and each of the signal lines 15 is provided to extend in column direction.

Each of regions surrounded by adjacent gate lines 14 and 14 and the signal lines 15 and 15 configures one pixel region and the thin film transistor 13 is provided to each pixel region. That is, a predetermined position in each pixel region, a portion of the lower side gate line 14 in the example of FIG. 1, is a gate electrode 13a, a portion of the first insulation layer 18 which covers the gate electrode 13a is a gate insulation film 13b, a semi-conductor layer 13c is provided to cover the gate insulation film 13b, an etching stopper layer 13d is provided on a surface of the semi-conductor layer 13c in the region of the gate electrode 13a, a pair of ohmic contact layers 13e and 13f which opposingly extend in column direction to cover a portion of a surface of the etching stopper layer 13d, and a drain electrode 13g and a source electrode 13h partially covering the pair of ohmic contact layers 13e and 13f are provided.

Here, the semi-conductor layer 13c, the pair of ohmic contact layers 13e and 13f, and the source electrode 13h are connected to the pixel electrode 12 via a contact hole 19a as described later and therefore the semi-conductor layer 13c, the pair of ohmic contact layers 13e and 13f, and the source electrode 13h are partially extended to the lower portion of the pixel electrode 12 as a base portion 13i. A connection portion 13j connects a portion which partially covers one ohmic contact layer 13f with the base portion 13i. The connection portion 13j extends to the vicinity of the left and right signal lines 15 and 15 in the pixel region.

A layered structure of the semi-conductor layer 13c, the etching stopper layer 13d, the pair of ohmic contact layers 13e and 13f, the drain electrode 13g, and the source electrode 13h of the thin film transistor 13 are formed on a surface of the first insulation layer 18 and the signal line 15 is also formed on the first insulation layer 18. Therefore, the signal line 15 also has a layered structure of the semi-conductor layer 13c, the pair of ohmic contact layers 13e and 13f, the drain electrode 13g, and the source electrode 13h and is formed simultaneously with the process for the thin film transistor 13.

A second insulation layer 19 is formed on the signal line 15, the first insulation layer 18, and the thin film transistor 13 in each pixel region.

In the second insulation layer 19, a contact hole 19a is formed on the source electrode 13h in each pixel region. On an upper surface of the second insulation layer 19, the pixel electrode 12 is provided for each pixel region. The plurality of pixel electrodes 12 are connected to the source electrodes 13h via each of the contact holes 19a in each pixel region. An outer periphery 12a of the pixel electrode 12 is located more outwardly than an inner periphery 16g of the storage capacity electrode 16. The pixel electrode 12 and the storage capacity electrode 16 overlap in the pixel region. A hatched portion in FIG. 1 schematically shows a portion between the outer periphery 12a of the pixel electrode 12 and the inner periphery 16g of the storage capacity electrode 16, that is, a portion where the electrodes overlap. Due to this overlapping, a storage capacity Cs is formed.

In the first embodiment, the shielding electrode 17 for electrically shielding between the gate line 14 and the pixel electrode 12 is further provided on the upper surface of the second insulation layer 19 in each of pixel region. The gate line 14 configures a portion of the gate electrode 13a connected to the pixel electrode 12 via the source electrode 13h and the semi-conductor layer 13c of the thin film transistor 13 That is, the pixel electrode 12 and the shielding electrode 17 are formed simultaneously as a top conductive layer.

The shielding electrode 17 is approximately L-shaped with a straight line portion 17a formed in parallel to the gate line 14 and a flared portion 17b which protrudes from the straight line portion 17a to an adjacent pixel region. Length of the straight line portion 17a in row direction is longer than width of the source electrode 13h of each pixel region in row direction. In other words, the straight line portion 17a of the shielding electrode 17 may have a length L2 which is parallel to longitudinal direction of the gate electrode 13a of each pixel electrode 12, that is, parallel to the direction to which the gate line extends. The length L2 is also a length of a side in lateral direction (horizontal direction in the figure) of each of the pixel electrodes 12. Moreover, each of the shielding electrodes 17 also has a length which bridges between left side portion 16d and right side portion 16e of each storage capacity electrode 16 respectively overlapping the left side portion 12b and right side portion 12c of each of the pixel electrodes 12 which are facing to each other. That is, each of the shielding electrodes 17 is longer than the distance L1 in FIG. 1. The flared portion 17b of the shielding electrode 17 protrudes beyond the gate line 14 in the same pixel region and reaches the flared portion 16f of the storage capacity electrode 16 in a pixel region adjacent in column direction. The contact hole 19b is formed in the region of the flared portion 16f of the storage capacity electrode 16 of the first and second insulation layers 18 and 19 and the flared portion 17b of the shielding electrode 17 is connected to the flared portion 16f of the storage capacity electrode 16 which is adjacent to the shielding electrode 17 in column direction via the contact hole 19b. Thus, the shielding electrode 17 crosses over the gate line 14, extends in column direction, and is connected to the storage capacity electrode 16 in a pixel region adjacent in column direction via the contact hole 19b.

Since the pixel electrode 12 and the shielding electrode 17 are formed on the second insulation layer 19, from a processing viewpoint, it is preferable to form the electrodes simultaneously with a transparent electrode metal such as ITO. However, the pixel electrode 12 and the shielding electrode 17 do not need to be on the same layer. The pixel electrode 12 may be provided on a layer upper than the layer of the shielding electrode 17 and a layer structure of the thin film transistor 13 may be provided below the shielding electrode 17 in a cross section structure.

In either case, the shielding electrode 17 may be formed closer to the liquid crystal layer 30 side than the connection portion 13j as a conductive layer for connecting the pixel electrode 12 and the source electrode 13h. With such a configuration, it enables to completely surround a periphery of the pixel electrode 12 by the storage capacity electrode 16 and the shielding electrode 17 and further to allow the conductive layer provided nearest to the liquid crystal layer 30 side in each of the surrounded region to function as the storage capacity electrode 16 or the shielding electrode 17. That is, it enables to surround a region corresponding to the pixel electrode 12 in the liquid crystal layer 30 by a potential give to the storage capacity electrode 16 or to the shielding electrode 17.

A vertical alignment layer (not shown) is provided on the plurality of pixel electrodes 12, the plurality of shielding electrodes 17, and the second insulation layer 19.

Structure of the opposite substrate 20, especially structure of a CF substrate will be explained.

The color filters 22 of red, green, and blue are provided on the surface of the transparent substrate 21 and the common electrode 23 is formed on the color filter 22. The protrusion 24 made of resin is provided on the common electrode 23 for each pixel region at the center of the pixel electrode 12 facing the common electrode 23, that is, in the vicinity of intersection point of diagonal lines. A vertical alignment layer (not shown) is formed to a plurality of protrusions 24 and common electrode 23.

A polarizer (not shown) is provided below the TFT substrate 10 and another polarizer (not shown) is provided above the opposite substrate 20 in the liquid crystal display device 1. Transmission axes of the polarizers are mutually orthogonal. The connection portion of the storage capacity line 16a extending outside the liquid crystal display region of the TFT substrate 10 and the common electrode 23 of the opposite substrate 20 are connected. Common potential is applied to the storage capacity line 16a and the common electrode 23. Here, the storage capacity line 16a and the common electrode 23 are not limited to direct connection and the storage capacity line 16a and the common electrode 23 may be connected to a power source supply circuit for outputting the common potential via different conductive paths respectively.

That is, a liquid crystal display device 1, includes, at least, a gate line 14 as a first conductive layer provided to extend the line in a predetermined direction; a thin film transistor 13 including a gate electrode 13a connected to the gate line 14; a first pixel electrode 12 provided as a second conductive layer closer to a liquid crystal layer 30 side than the first conductive layer; a shielding electrode 17 provided in a region between a location region of the gate line 14 and a location region of the first pixel electrode 12 as a conductive layer closer to the liquid crystal layer side than the first conductive layer; a connection portion 13j provided to at least partially overlap the shielding electrode 17 and closer to the first conductive layer side than the shielding electrode 17 to connect a source electrode 13h of the thin film transistor 13 with the first pixel electrode 12; a common electrode 23 which is opposing the first pixel electrode 12 via the liquid crystal layer 30 and is set to have the same potential as the shielding electrode 17; and a storage capacity electrode 16 provided as the first conductive layer and set to have the same potential as the shielding electrode 17.

A role of the shielding electrode 17 in the liquid crystal display device 1 will be explained.

Figure 3:
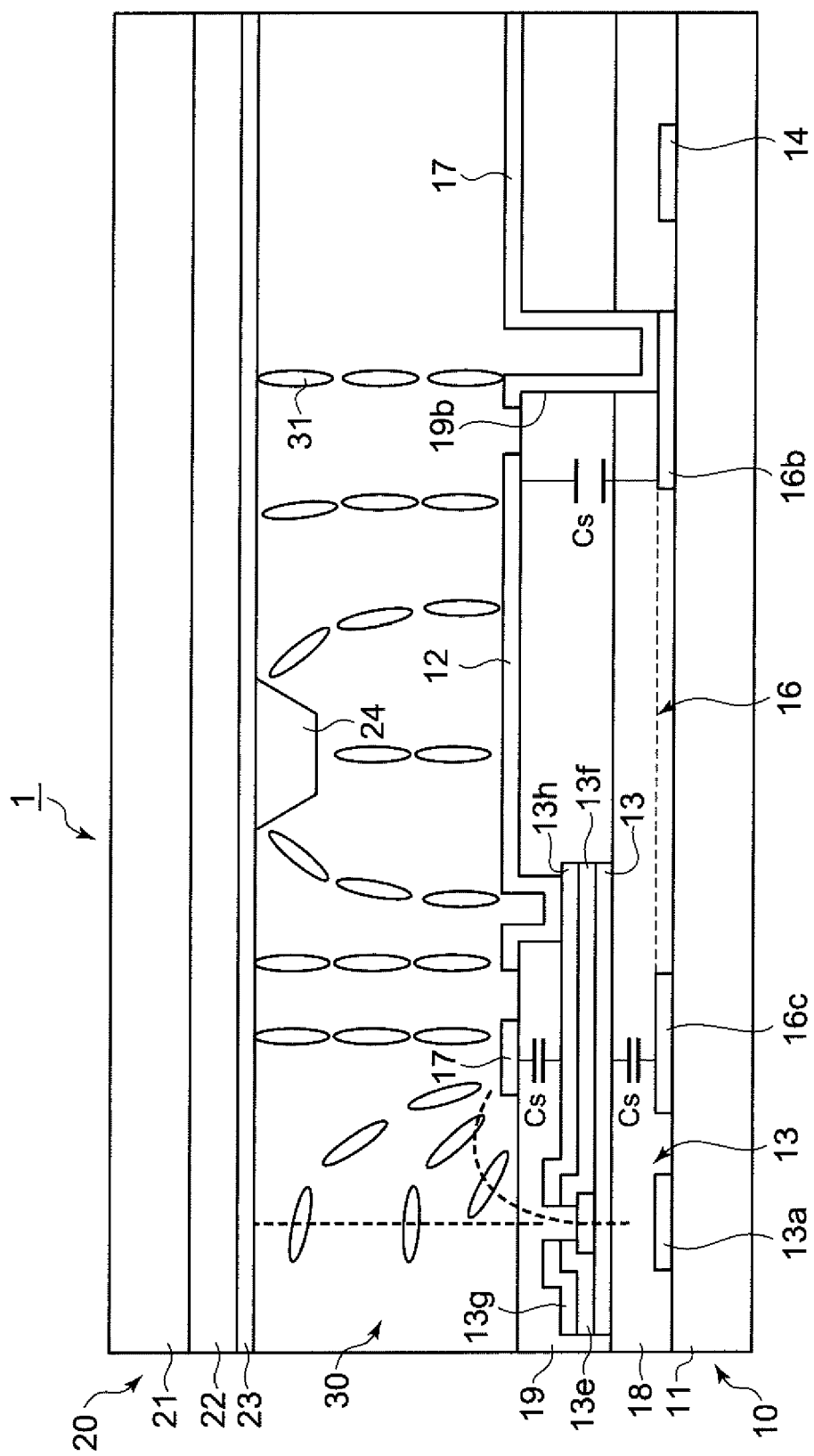
FIG. 3 is a view schematically showing an action of liquid crystal molecules in a case where there is no difference between potentials of the common electrode and the pixel electrode in the liquid crystal display device shown in FIG. 1.
Figure 4:
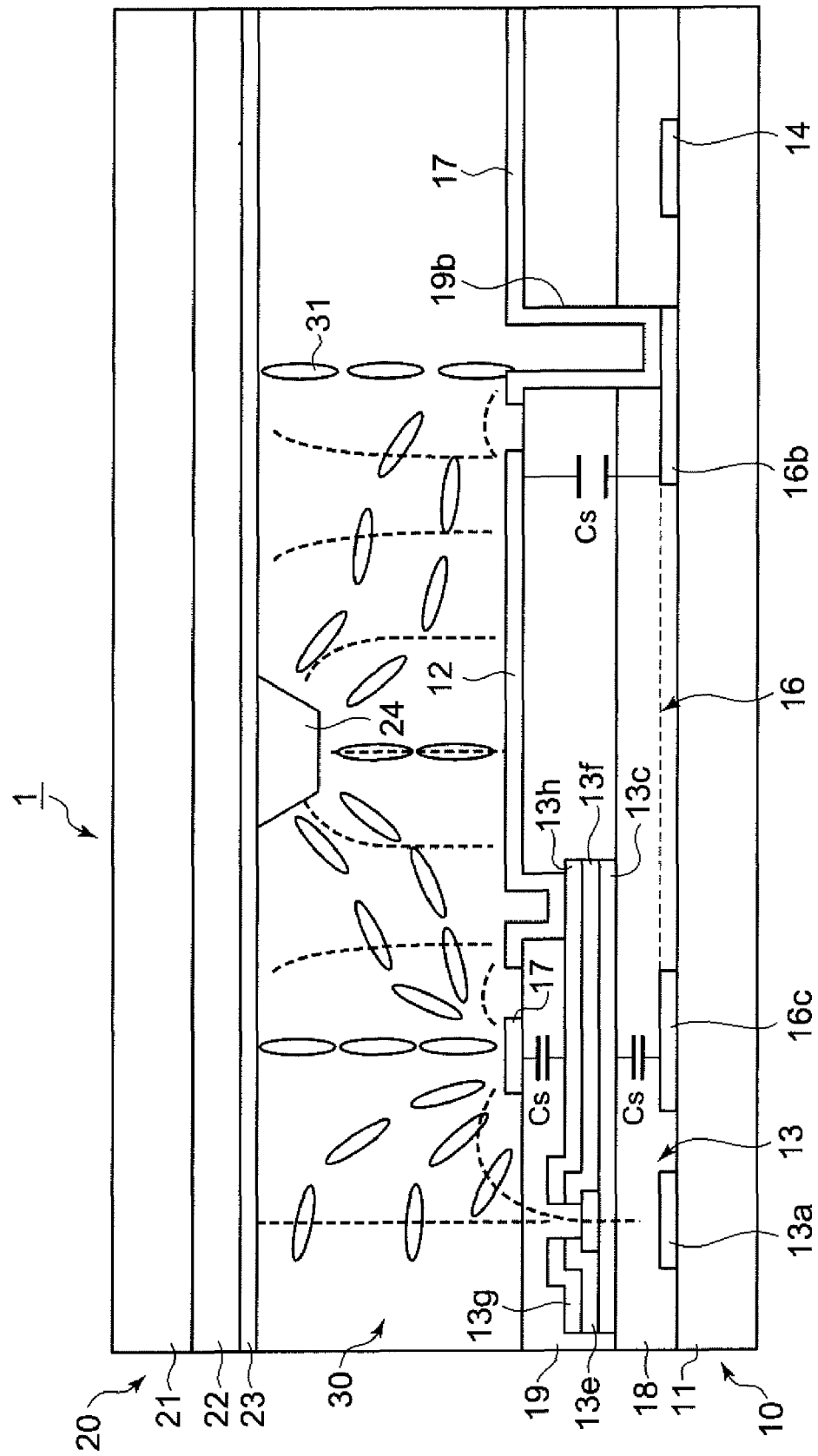
FIG. 4 is a view schematically showing an action of the liquid crystal molecules in a case where there is difference between potentials of the common electrode and the pixel electrode in the liquid crystal display device shown in FIG. 1.
Figure 5:
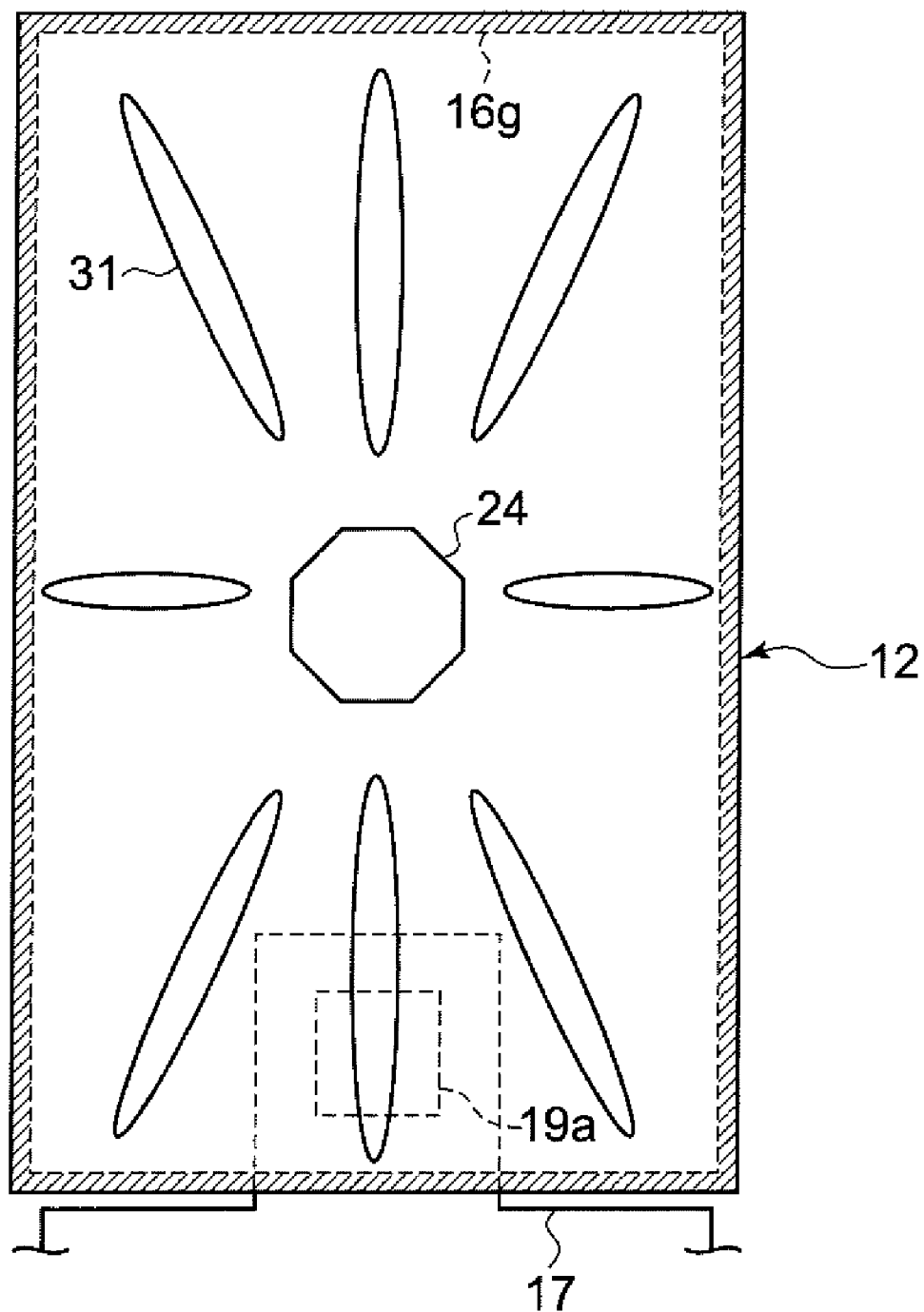
FIG. 5 is a plane view schematically showing an action of the liquid crystal molecules in a case where there is difference between potentials of the common electrode and the pixel electrode in the liquid crystal display device shown in FIG. 1.

FIG. 3 schematically shows an action of liquid crystal molecules 31 in a case where there is no difference between potentials of the common electrode 23 and the pixel electrode 12 in the cross-section structure shown in FIG. 2. FIG. 4 schematically shows an action of the liquid crystal molecules 31 in a case where there is difference between potentials of the common electrode 23 and the pixel electrode 12 in the cross-section structure shown in FIG. 2. FIG. 5 is a plane view schematically showing an action of the liquid crystal molecules 31 in a case where there is difference between potentials of the common electrode 23 and the pixel electrode 12.

If there is no difference between potentials of the common electrode 23 and the pixel electrode 12 in the liquid crystal display device 1, that is, in a case of black display, the storage capacity electrode 16 is partially protruded to the outside of the upper and left and right edges of the pixel electrode 12 via the first and second insulation layers 18 and 19 and the storage capacity electrode 16 is connected with the common electrode 23 outside of the region in one pixel region, as shown in FIG. 3. Therefore, the shielding electrode 17 has the same potential as the common electrode 23. Moreover, the shielding electrode 17 on an upper side of the pixel electrode 12 (on the right side in FIG. 3) is connected to the storage capacity electrode 16 via the contact hole 19b and the storage capacity electrode 16 is connected to the common electrode 23 outside the region. Therefore, the shielding electrode 17 has the same potential as the common electrode 23.

Meanwhile, the shielding electrode 17 is provided on a lower side of the pixel electrode 12 (on the left side in FIG. 3) and the shielding electrode 17 protrudes to an adjacent pixel region to be connected to the storage capacity electrode 16 via the contact hole 19b. Therefore, the shielding electrode 17 has the same potential as the common electrode 23. Moreover, the lower portion of the pixel electrode 12 has the same potential as the common electrode 23, also as the source electrode 13h connected via the second insulation layer 19.

Therefore, the liquid crystal molecules 31 between the whole periphery of the pixel electrode 12 and the common electrode 23 are oriented to stand perpendicularly to the alignment layer. In the periphery of the protrusion 24 on the common electrode 23 side, the liquid crystal molecules 31 are oriented to be orthogonal to a surface of the alignment layer on the protrusion 24. Therefore, the liquid crystal molecules 31 in one pixel region are symmetrically positioned with the protrusion 24 as a central axis and oriented center position is stabilized.

Here, if voltage is applied to the gate electrode 13a, there occurs a difference between potentials of the gate electrode 13a and the shielding electrode 17 and an electric field (electric line of force) is generated as shown by the dotted lines in the figure. Therefore, the liquid crystal molecules 31 in the region of the gate line 13a fall so as to be orthogonal to the electric line of force and the liquid crystal molecules 31 are mis-oriented. However, because the liquid crystal molecules 31 in this region have device characteristics of a thin film transistor, a light shielding film (not shown) is provided on the opposite substrate side and therefore mis-orientation of the liquid crystal molecule 31 does not influence the display quality.

On the other hand, if difference in potentials between the common electrode 23 and the pixel electrode 12 is generated in the liquid crystal display device 1, in other words, in a case of white display, the pixel electrode 12 comes to have a different potential from that of the common electrode 23 in one pixel region. Then, there exists difference in potential among the shielding electrode 17 on the upper side of the pixel electrode 12 (on the right side in FIG. 4), the shielding electrode 17 on the lower side of the pixel electrode 12 (on the left side in FIG. 4), and the common electrode 23 respectively and an electric field (electric line of force) as shown by the dotted line in FIG. 4 is generated. Therefore, Each of the liquid crystal molecules 31 is oriented to cross the electric field. However, because the shielding electrode 17 on the upper side of the pixel electrode 12 (on the right side in FIG. 4) and the common electrode 23 have the same potential, the shielding electrode 17 on the lower side (on the left side in FIG. 4) and the common electrode 23 have the same potential, and the storage capacity electrode 16 partially extends to the outside of both left and right edges of the pixel electrode 12 via the first and the second insulation layers 18 and 19, and the storage capacity electrode 16 is connected with the common electrode 23 outside, the shielding electrode 17 has the same potential as the common electrode 23. Because the line of electric force generated in the region of the pixel electrode 12 is not influenced by an external factor, for example, the gate electrode 13a to which relatively large voltage is applied, and the electric field is not generated between the circumference of the pixel electrode 12 and the common electrode 23, Each of the liquid crystal molecules 31 in the region of the pixel electrode 12 is not influenced by an external electric field and Each of the liquid crystal molecules 31 between the pixel electrode 12 and the common electrode 23 falls to the center axis side of the protrusion 24.

That is, the liquid crystal molecules of the liquid crystal layer 30 are oriented in a radial manner with the protrusion 24 as center of orientation. At this time, the circumference of the pixel electrode 12 is uniformized by the potential that is same as the common electrode 23 due to the shielding electrode 17 and the storage capacity electrode 16. Therefore, it enables to obtain radial orientation without distortion.

As explained above, even if there is a difference between potentials of the pixel electrode 12 and the common electrode 23, there is seamlessly generated a no-electric field state in the circumference of the pixel electrode between the common electrode 23 and the pixel electrode 12. Therefore, irrespective of existence of difference in potentials between the pixel electrode 12 and the common electrode 23, center position of orientation is stabilized and as shown in FIG. 5, the liquid crystal molecules 31 fall toward the protrusion 24 and symmetric property of the liquid crystal molecules 31 in the periphery of the protrusion 24 is not broken. Therefore, it enables to display a clear image.

Moreover, even in a case where external pressure from, for example, the surface of the liquid crystal display device, is applied to temporarily change a cell gap and the center position of the radial orientation is shifted from the position where the protrusion is provided, the center position of the radial orientation rapidly returns to the position where the protrusion is provided. It is because the circumference of the pixel electrode 12 has the same potential as the common electrode 23.

As shown in the FIGS. 3 and 4, in the liquid crystal display device 1 according to the first embodiment, the storage capacity Cs is formed between the upper left and right edges of the pixel electrode 12 and the storage capacity electrode 16 respectively in each pixel region and the storage capacity Cs is also formed between the lower edge of the pixel electrode 12 and the source electrode 13h. Moreover, the storage capacity Cs is also formed between the shielding electrode 17 and the source electrode 13h. In other words, the storage capacities Cs are formed between the shielding electrode 17 and the storage capacity electrode 16 in both upper and lower sides of the source electrode 13h when seen by cross-section structure. Therefore, if the shielding electrode 17 is provided, area of the storage capacity electrode 16 can be reduced by the amount of increased storage capacity Cs.

The figures illustrate the shielding electrode 17 in each pixel region is connected to the storage capacity electrode 16 in a pixel region adjacent in column direction via the contact hole 19b. It is needless to illustrate that the shielding electrode 17 in each pixel region may be connected to the storage capacity electrode in the same pixel region via a contact hole.

Second Embodiment

Figure 6:
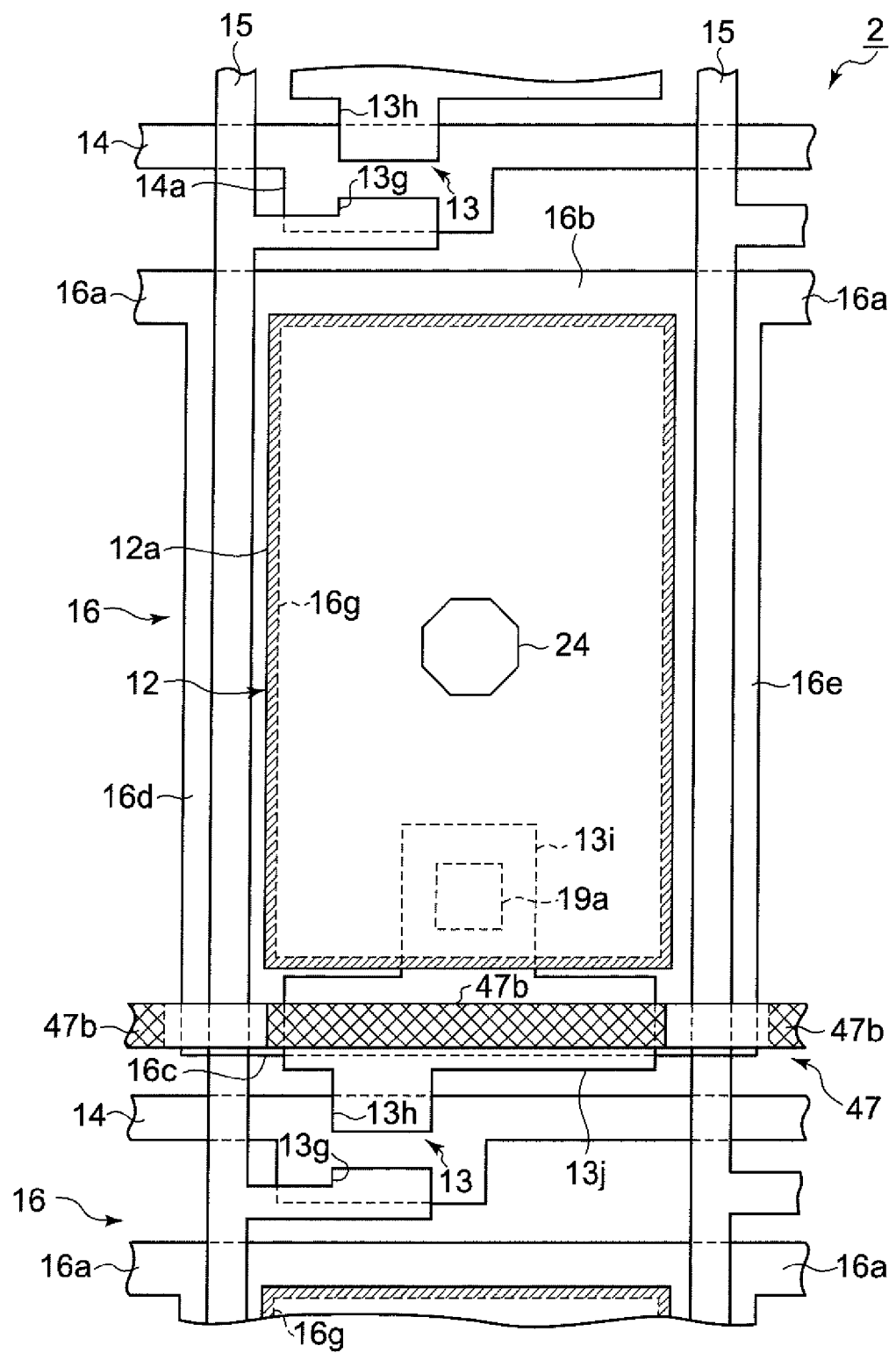
FIG. 6 is a plane view of a liquid crystal display device according to a second embodiment of the present invention.

FIG. 6 is a plane view of a liquid crystal display device 2 according to a second embodiment of the present invention. The liquid crystal display device 2 according to the second embodiment is different from the first embodiment in the following points. Note that the other configuration is the same as that in the first embodiment and therefore same reference numerals are given to the same or corresponding components.

A shielding electrode 47b is provided in each pixel region on the second insulation layer 19. The shielding electrode 47b is provided between the lower edge of the pixel electrode 12 provided in the pixel region and the gate line 14 configuring the gate electrode 13a of the thin film transistor 13. The shielding electrode 47b in each pixel region is connected to another shielding electrode 47b in another pixel region which is adjacent in row direction. The shielding electrodes 47b extend outside the liquid crystal display region as a shielding line 47 as a whole. Of the shielding line 47, a connection portion which extends outside the liquid crystal display region is connected to the common electrode 23 of the opposite substrate 20. Therefore, the shielding electrode 47b in each pixel region has the same potential as the common electrode 23.

In the second embodiment, it is not required to connect the shielding electrode 17 with the storage capacity electrode 16 in each pixel region via the contact hole 19b as in the first embodiment shown in FIG. 1. Therefore, it is effective in a case where a contact hole cannot be formed in a pixel region. Needless to say, it is not required to provide a flared portion for the storage capacity electrode 16 for connecting the shielding electrode via the contact hole as in the first embodiment.

In the second embodiment, similarly to the first embodiment, each of the liquid crystal molecules 31 between the common electrode 23 and each of the pixel electrodes 12 is not influenced by the external electric field irrespective of whether or not there is generated a difference in potential between the common electrode 23 and the pixel electrode 12. Therefore the position of the orientation center with the protrusion as a center axis is not shifted.

Third Embodiment

Figure 7:
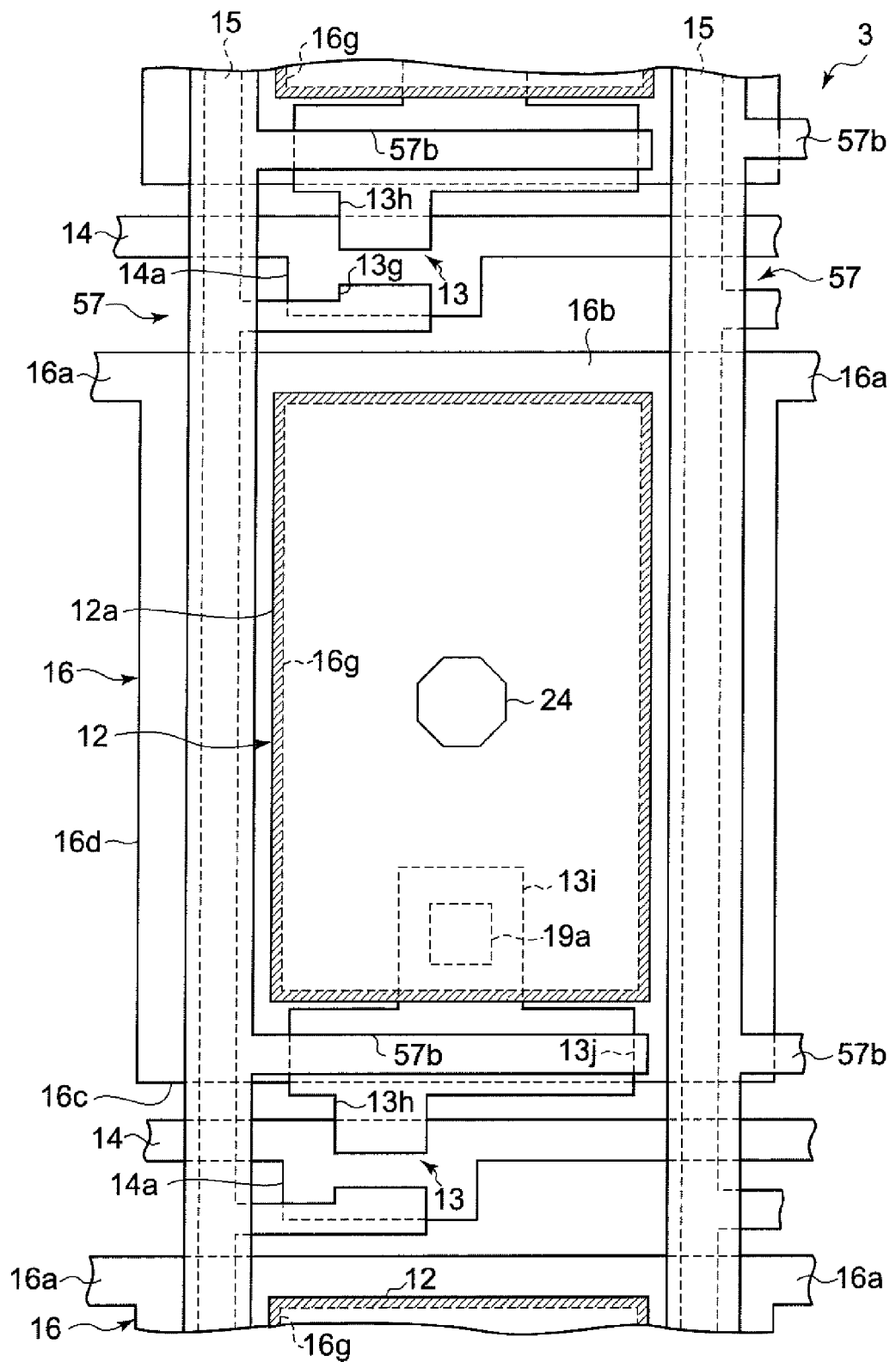
FIG. 7 is a plane view of a liquid crystal display device according to a third embodiment of the present invention.

In the above-mentioned second embodiment, the shielding electrodes in each pixel region are connected in row direction and extend to outside of the display region to form the shielding electrode line. However, the shielding electrodes in each pixel region may be connected in column direction and extend to outside of the display region to form a shielding electrode line. FIG. 7 is a plane view of a liquid crystal display device 3 according to a third embodiment of the present invention. Note that the other configuration is the same as that in the first embodiment and therefore same reference numerals are given to the same or corresponding components.

A shielding electrode 57b is provided in each pixel region on the second insulation layer 19 and the shielding electrode 57b is provided between the lower edge of the pixel electrode 12 provided in the pixel region and the gate line 14 configuring the gate electrode 13a of the thin film transistor 13. The shielding electrode 57b in each pixel region is connected to another shielding electrode 57b in another pixel region which is adjacent in column direction and the shielding electrodes 57b extend outside the liquid crystal display region as a shielding line 57 as a whole. Of the shielding line 57, a connection portion which extends outside the liquid crystal display region is connected to the common electrode 23 of the opposite substrate 20. Therefore, the shielding electrode 57b in each pixel region has the same potential as the common electrode 23.

In the third embodiment, it is not required to connect the shielding electrode 17 with the storage capacity electrode 16 in each pixel region via the contact hole 19b as in the first embodiment shown in FIG. 1. Therefore, it is effective in a case where a contact hole cannot be formed in a pixel region. Needless to say, it is not required to provide a flared portion for the storage capacity electrode 16 for connecting the shielding electrode via the contact hole as in the first embodiment.

In the third embodiment, similarly to the first and second embodiments, each of the liquid crystal molecules 31 between the common electrode 23 and each of the pixel electrodes 12 is not influenced by the external electric field, especially the strong electric field from the gate electrode 13a, irrespective of whether or not there is generated a difference in potential between the common electrode 23 and the pixel electrode 12, the orientation of the liquid crystal molecules 31 becomes symmetric with the protrusion 24 as its center, and the center of the orientation is not shifted.

Here, in either the second or the third embodiment, the shielding electrode 47b or 57b aligned in column or row direction may be connected by a part of the shielding line 47 or 57. However, as shown in the first embodiment, it is also acceptable to connect the shielding electrode 47b or 57b through a contact hole which is provided to penetrate the first and the second insulation layers 18 and 19 so that the shielding electrode can be connected to the storage capacity electrode 16 or the storage capacity line provided on the transparent substrate 11. If this configuration is used, processing yield can be improved.

Embodiment of the present invention is not limited to the above-mentioned ones but may be changed as explained below within the scope described in the claim.

Figure 8:
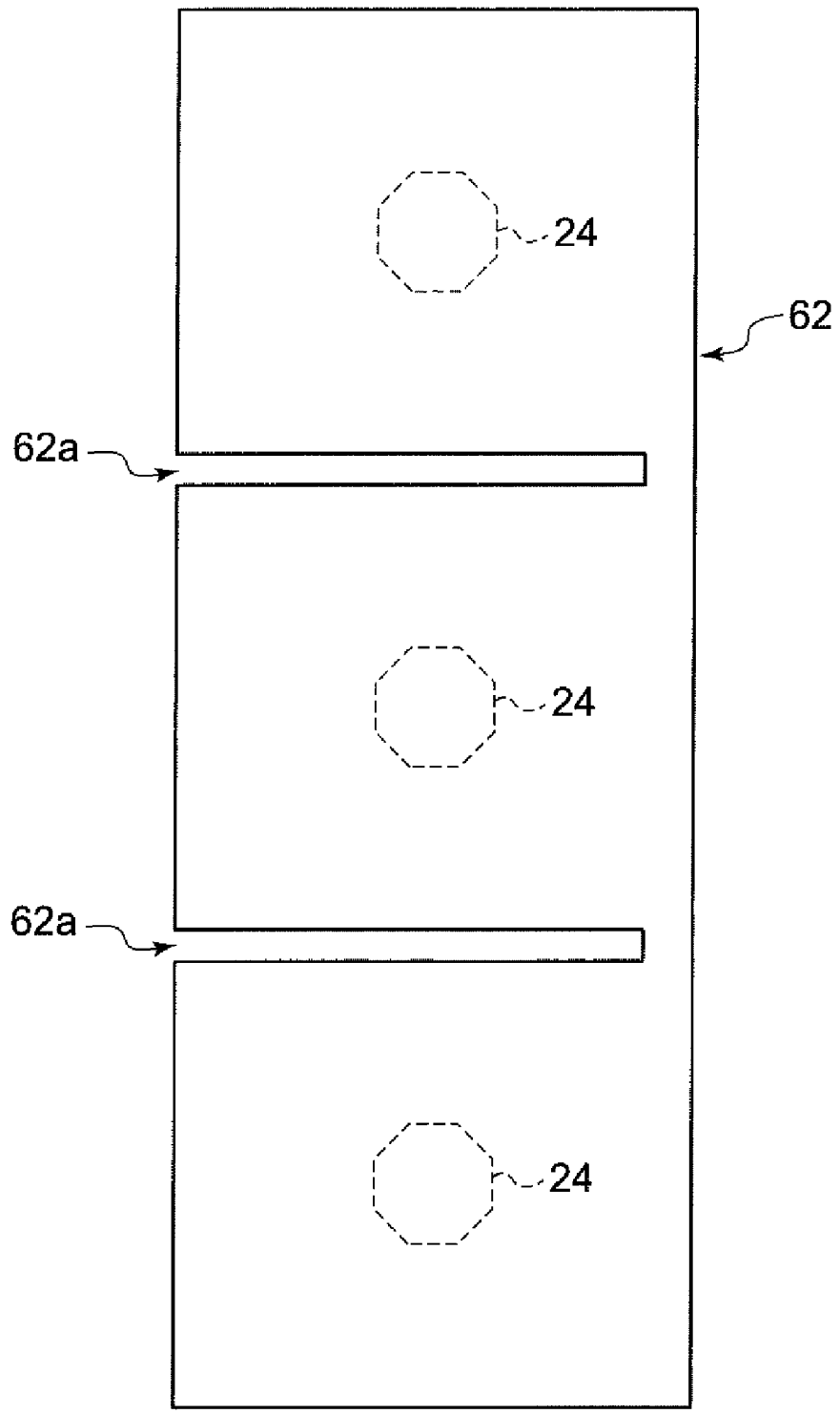
FIG. 8 is a plane view of a variation as to a pixel electrode.
Figure 9:
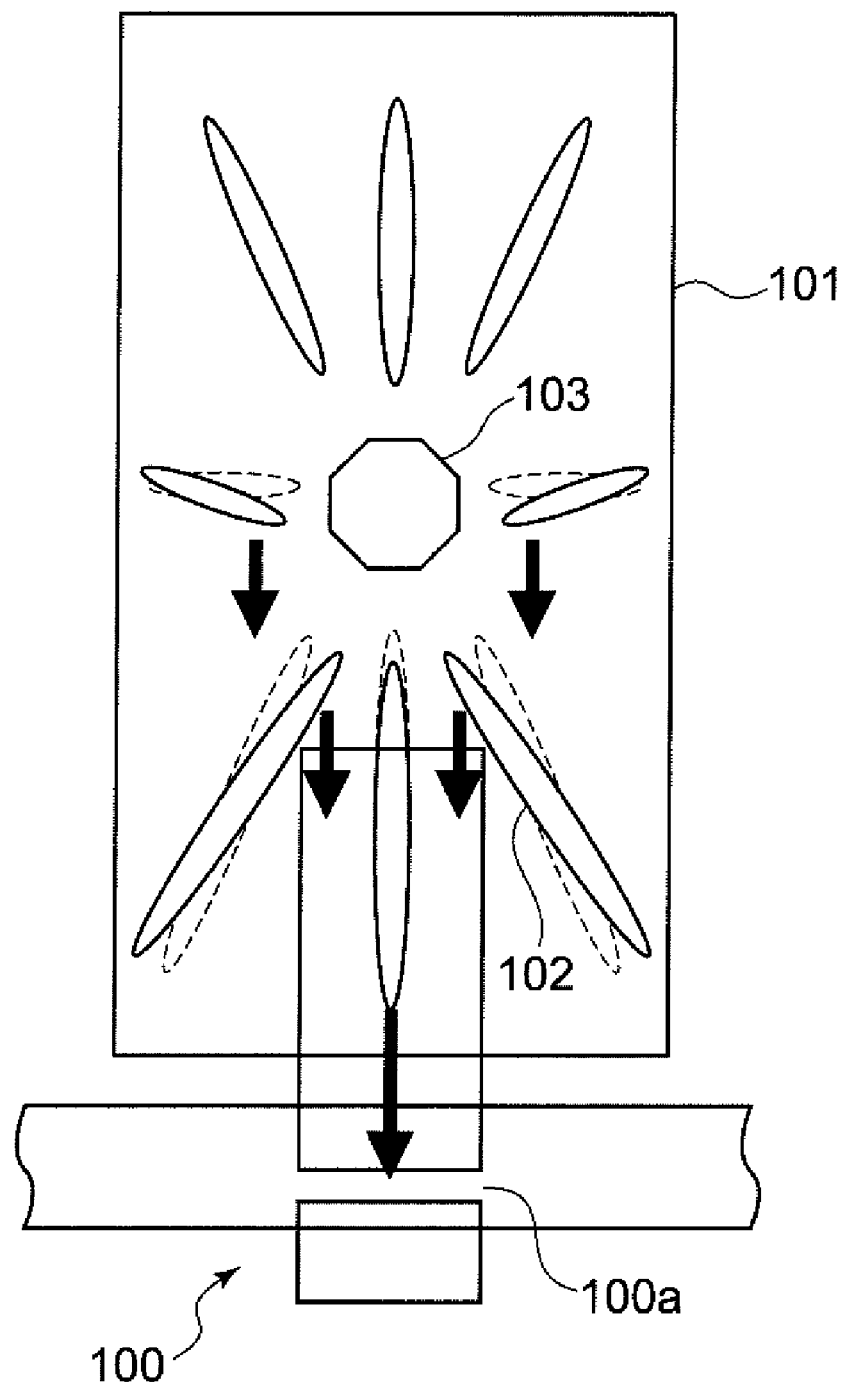
FIG. 9 is a view to explain a problem which inventions solve.

For example, in any of the above-mentioned embodiments, one protrusion 24 is provided to one pixel electrode 12 in a corresponding manner. However, in a case where the pixel region is long in column direction as shown in the figure, slits 62a may be provided in row direction to divide a pixel electrode 62 into, for example, three, as shown in FIG. 8. Then, the pixel electrode 62 may be divided into three regions and the protrusion 24 may be provided on the opposite substrate 20 side for each of the divided regions.

For example, in the first to third embodiments, a alignment layer formed on both the TFT substrate 10 and the opposite substrate 20 is a vertical aligned layer and the liquid crystal molecule in the liquid crystal layer have negative permittivity anisotropy. However, the embodiments of the present invention are not limited thereto and a horizontal aligned layer may be provided to both the TFT substrate 10 and the opposite substrate 20 so that the liquid crystals have positive permittivity anisotropy. In this case, though not shown, the common electrode 23 is not formed on the opposite substrate but is formed adjacent the pixel electrode on the TFT substrate 10 side. In other words, this configuration can be applied to a liquid crystal display device in which liquid crystals exist between the pixel electrode and the common electrode and control to display.

Moreover, for example, in the first to third embodiments, the drain electrode 13g of the thin film transistor 13 is connected to the signal line 15 and the source electrode 13j of the thin film transistor 13 is connected to the pixel electrode via the contact hole 19a. However, contrary to the above, the source electrode of the thin film transistor 13 may be connected to the signal line 15 and the drain electrode of the thin film transistor 13 may be connected to the pixel electrode 12 via the contact hole 19a.

What is claimed is:
1. A liquid crystal display device, comprising:
a pair of substrates facing each other via a liquid crystal layer;
a gate line provided in one substrate of the pair of substrates, the gate line being disposed to extend in a first direction;
a first storage capacity electrode disposed in a same layer as the gate line;
a thin film transistor including a gate electrode connected to the gate line;
a first pixel electrode disposed closer to the liquid crystal layer than the gate line through a first insulating layer and a second insulating layer;
a shielding electrode provided in a same layer as the first pixel electrode, the shielding electrode being disposed such that, in a plan view, at least a part thereof is located in a planar region existing between the gate line and the first pixel electrode;
a connection portion provided in a layer between the gate line and the first pixel electrode, the connection portion electrically connecting a source electrode of the thin film transistor with the first pixel electrode; and
a common electrode that faces the first pixel electrode via the liquid crystal layer and that is set to have the same potential as the shielding electrode,
wherein the first storage capacity electrode is set to have a same potential as that of the shielding electrode,
wherein the first storage capacity electrode and the connection portion have an overlapping region in a plan view,
wherein the shielding electrode covers a part of the overlapping region of the first capacity storage electrode and the connection portion through the second insulating layer along the first direction, wherein a length of the connection portion along the first direction is longer than a length of the source electrode along the first direction, and wherein a length of the shielding electrode along the first direction is longer than the length of the connection portion along the first direction.

2. The liquid crystal display device according to claim 1, wherein the first storage capacity electrode is provided so as to surround the periphery of the first pixel electrode.

3. The liquid crystal display device according to claim 2, wherein the shielding electrode and the first storage capacity electrode are provided to allow a region corresponding to the first pixel electrode in the liquid crystal layer to be surrounded by the potential given to the shielding electrode or the first storage capacity electrode.

4. The liquid crystal display device according to claim 1, wherein the first storage capacity electrode is provided so as to at least partially overlap the first pixel electrode in a plan view.

5. The liquid crystal display device according to claim 1, wherein the connection portion connects the source electrode of the thin film transistor with the first pixel electrode via a region where the first storage capacity electrode and the shielding electrode overlap in a plan view.

6. The liquid crystal display device according to claim 1, further comprising:

a second pixel electrode provided so as to allow the gate line to exist between the first pixel electrode and the second pixel electrode; and a second storage capacity electrode set to have the same potential as the shielding electrode, wherein the second storage capacity electrode is provided so as to at least partially overlap the second pixel electrode in a plan view and so as to surround the periphery of the second pixel electrode.

7. The liquid crystal display device according to claim 6, wherein the shielding electrode is connected to the second storage capacity electrode via a first contact hole provided in the first insulating layer and the second insulating layer.

8. The liquid crystal display device according to claim 1, wherein the liquid crystal layer has liquid crystal molecules having negative permittivity anisotropy.

9. The liquid crystal display device according to claim 8, wherein a protrusion having a predetermined shape is formed on the liquid crystal layer side of the common electrode.

10. The liquid crystal display device according to claim 1, wherein the gate line has a flared portion extending from the gate line toward the side opposite to the location direction of the first pixel electrode, and the flared portion is the gate electrode in the thin film transistor.

11. The liquid crystal display device according to claim 1, wherein the first pixel electrode is formed to have a side opposing the shielding electrode to be parallel to the first direction.

12. The liquid crystal display device according to claim 1, wherein a plurality of slits are formed in the first pixel electrode.

13. The liquid crystal display device according to claim 1, wherein display pixels having the first pixel electrode are arranged in a matrix.

14. A liquid crystal display device, comprising:

a pair of substrates facing each other via a liquid crystal layer;

a gate line provided in one substrate of the pair of substrates, the gate line being disposed to extend in a first direction;

a first storage capacity electrode and a second storage capacity electrode disposed in a same layer as the gate line, the first storage capacity electrode and the second storage capacity electrode being disposed on opposing sides of the gate line therebetween;

a thin film transistor having a gate electrode connected to the gate line;

a first pixel electrode and a second pixel electrode disposed closer to the liquid crystal layer than the gate line through a first insulating layer and a second insulating layer, the first pixel electrode and the second pixel electrode being disposed on opposing sides of the gate line therebetween;

a shielding electrode provided in a same layer as the first pixel electrode, the shielding electrode being disposed such that, in a plan view, at least a part thereof is located in a planar region existing between the first pixel electrode and the gate line;

a connection portion formed in a layer between the gate line and the first pixel electrode, the connection portion electrically connecting a source electrode of the thin film transistor and the first pixel electrode; and a common electrode disposed to face the first pixel electrode and the second pixel electrode via the liquid crystal layer, the common electrode being set to have a same potential as that of the shielding electrode, wherein the first storage capacity electrode and the second storage capacity electrode are set to have the same potential as that of the shielding electrode, wherein the shielding electrode is connected to the second storage capacity electrode via a contact hole formed in the first and second insulating layers, wherein the first storage capacity electrode and the connection portion have an overlapping region in a plan view, wherein the shielding electrode covers a part of the overlapping region of the first storage capacity electrode and the connection portion through the second insulating layer along the first direction, wherein a length of the connection portion along the first direction is longer than a length of the source electrode along the first direction, and wherein a length of the shielding electrode along the first direction is longer than the length of the connection portion along the first direction.

15. A liquid crystal display device according to claim 2, wherein a length of the connection portion along the first direction is longer than a length of the source electrode along the first direction, and is shorter than a length which bridges between inner sides facing each other in the first direction among inner sides of the first storage capacity electrode, which respectively face each other.

16. A liquid crystal display device according to claim 1, wherein the shielding electrode is formed with the same material as that of the first pixel electrode.

17. A liquid crystal display device according to claim 1, wherein the shielding electrode has the substantially same length as the length in the first direction of the first pixel electrode.

18. A liquid crystal display device according to claim 1, wherein the shielding electrode forms a storage capacitance with the connection portion through the second insulating layer.

19. The liquid crystal display device according to claim 1,
wherein the connection portion is partially extended to a lower portion of the first pixel electrode to form a base portion, and is connected to the first pixel electrode via a second contact hole in a center portion of the base portion, and the base portion and the second contact hole are located on a side of the first pixel electrode that is closer to the gate line and in a substantially middle of the pixel electrode with respect to the first direction.

20. The liquid crystal display device according to claim 14,
wherein the first storage capacity electrode is disposed so as to partially overlap the first pixel electrode in a plan view and so as to surround a periphery of the first pixel electrode, and
wherein the second storage capacity electrode is disposed so as to partially overlap the second pixel electrode in a plan view and so as to surround a periphery of the second pixel electrode.

21. The liquid crystal display device according to claim 20,
wherein the shielding electrode and the first storage capacity electrode are provided to allow a region corresponding to the first pixel electrode in the liquid crystal layer to be surrounded by the potential given to the shielding electrode or the first storage capacity electrode.

22. The liquid crystal display device according to claim 14,
wherein the shielding electrode has a substantially same length as a length of the first pixel electrode along the first direction.

* * * * *